(12) United States Patent
Usami

(10) Patent No.: US 6,294,833 B1
(45) Date of Patent: Sep. 25, 2001

(54) SEMICONDUCTOR DEVICE AND FABRICATION PROCESS THEREOF

(75) Inventor: Tatsuya Usami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/481,885

(22) Filed: Jan. 12, 2000

Related U.S. Application Data

(62) Division of application No. 08/996,105, filed on Dec. 22, 1997, now Pat. No. 6,222,269.

(30) Foreign Application Priority Data

Dec. 25, 1996 (JP) .................................................. 8-344725

(51) Int. Cl.⁷ .................................................. H01L 23/48
(52) U.S. Cl. .................................................. 257/758
(58) Field of Search .................................. 257/758, 751, 257/760

(56) References Cited

U.S. PATENT DOCUMENTS 5,708,303 * 1/1998 Jeng ....................................... 257/758

* cited by examiner

*Primary Examiner*—Roy Potter
(74) *Attorney, Agent, or Firm*—Hutchins, Wheeler & Dittmar

(57) ABSTRACT

Described in the present invention is a semiconductor device in which a plurality of interconnect lines are disposed, through an insulating layer, on the same layer above a semiconductor substrate having a semiconductor element; a first interlevel insulator is formed selectively in a narrowly-spaced region between adjacent interconnect lines; a second interlevel insulator is formed in a widely-spaced region between said adjacent interconnect lines, and the first interlevel insulator has a smaller dielectric constant than the second interlevel insulator. According to such a constitution, strength and reliability can be heightened and performance can be improved easily even in a miniaturized interconnect structure.

4 Claims, 9 Drawing Sheets

SEMICONDUCTOR DEVICE AND FABRICATION PROCESS THEREOF

This application is a Divisional of U.S. Application Ser. No. 08/996,105, filed Dec. 22, 1997 now U.S. Pat. No. 6,222,269.

BACKGROUND OF THE INVENTION

1. Field of the Invention

This invention relates to a semiconductor device and fabrication process thereof, particularly to a miniaturized interconnect structure and fabrication process thereof.

2. Description of the Related Art

With a tendency to miniaturization of a semiconductor element, multilevel miniaturized interconnection has become indispensable for the constitution of a semiconductor device. In recent days, as an interlevel insulator for such a semiconductor device having multilevel interconnection, silicon dioxide film type insulators having a relatively small dielectric constant and stable quality have come to be used mainly in order to reduce a parasitic capacitance between upper and lower interconnect layers or within the same interconnect layers.

The miniaturization of a semiconductor element brings about reductions in the interconnect width and interconnect distance of the lower layers, but it becomes necessary to secure a certain extent of cross-sectional area for interconnection to avoid an increase in the interconnect resistance. As a result, an aspect ratio (interconnect height/ interconnect distance) between interconnect layers as well as an aspect ratio (interconnect height/interconnect width) of an interconnect layer shows an increase, which has come to bring about a marked increase in a parasitic capacitance between interconnect layers, lower a propagation rate of signals or cause crosstalk (a phenomenon that signal noises appear between adjacent interconnect layers) between interconnect layers frequently.

When a large stepped portion exists on the surface of an interlevel insulator, a fine resist pattern cannot be formed, upon formation of an upper interconnect layer, by photolithography because of a shortage in a focus margin. Even if a fine resist pattern can be formed, disconnecting portion or etching remnants of interconnect materials are generated at the stepped portion of the upper layer owing to a large step difference. The surface of an interlevel insulator is therefore required to be planarized.

With a view to overcoming the problems caused by such fine multilevel interconnection, various means of employing an interlevel insulator having a low dielectric constant have been proposed. For example, proposed is a technique described in "Semiconductor World, No. 8, 26–30(1995)" which is a monthly journal. The proposed technique will next be described with reference to accompanying drawings.

FIGS. 8 and 9 are cross-sectional views of a double-level interconnect structure for illustrating the above conventional technique in the order of fabrication steps. As illustrated in FIG. 8(a), a thick insulating layer 101 is formed on the surface of a silicon substrate. Over this thick insulating layer 101, a first barrier metal layer 102, a first interconnect metal layer 103 and a second barrier metal layer 104 are formed by stacking them one after another. Over the second barrier metal layer 104, a mask insulating layer 105 is formed, followed by the formation of a resist mask 101a by photolithography.

With the resist mask 101a as an etching mask, the mask insulating layer 105 is subjected to reactive ion etching (RIE), whereby hard mask layers 105a and 105b are formed. The resist mask 101a is then removed, followed by dry etching of the second barrier layer 104, first interconnect metal layer 103 and first barrier metal layer 102 successively with the hard mask layers 105a and 105b as masks. In this manner, as illustrated in FIG. 8(b), formed on the thick insulating layer 101 are the first barrier metal layers 102a and 102b, on which first interconnect layers 103a and 103b are formed, respectively. On the first interconnect layers 103a and 103b, second barrier metal layers 104a and 104b are formed, respectively.

As illustrated in FIG. 8(c), a protective insulating layer 106 is then formed to cover the whole surface, followed by the formation of an organic SOG layer 107.

As illustrated in FIG. 8(d), the organic SOG layer 107 is then polished by chemical machanical polishing (CMP) and is planarized. Here, the protective insulating layer 106 functions as an etching stopper layer. In this manner, a first interlevel insulator composed of a protective insulating layer 106 and an organic SOG layer 107 is formed. The organic SOG layer 107 is a low-dielectric-constant insulating layer having a relative dielectric constant as low as about 3. In comparison, a silicon dioxide layer has a relative dielectric constant of about 4.

As illustrated in FIG. 9(a), a second interlevel insulator 108 is formed over the first interlevel insulator, followed by the formation of a through-hole 109, which reaches the second barrier metal layer 104a, in an interlevel insulator, that is, a second interlevel insulator 108, the protective insulating layer 106 and the hard mask layer 105a above the first interconnect layer 103a.

As illustrated in FIG. 9(b), a metal plug 110 to be connected with the second barrier metal layer 104a is then filled in the through-hole and a third barrier metal layer 111 to be connected with the metal plug 110, a second interconnect layer 112 and a fourth barrier metal layer 113 are formed successively.

In such an interconnect structure, the first interconnect layers 103a and 103b which are contiguous each other are formed on the thick insulating layer 101 with the insulating layer formed of the protective insulating layer 106 and organic SOG layer 107 therebetween. The interlevel insulator formed in the lower interconnect region has been planarized.

According to the above-described manner, an interconnect structure having a low-dielectric-constant insulating film formed between adjacent interconnect lines and having a planarized interlevel insulator can be fabricated.

In the interconnect structure of a semiconductor device according to the conventional method as described above, however, a low-dielectric-constant insulating layer is formed even in a widely-spaced region between adjacent interconnect lines. The low-dielectric-constant insulating layer has, in general, a large coefficient of thermal expansion and its strength is low, which tends to cause cracks in the interlevel insulator of the semiconductor device. Particularly, in the case of a multilevel interconnect structure, such a phenomenon occurs frequently.

According to the conventional method, a low-dielectric-constant insulating layer is formed all over the region except the interconnect lines and the side portions of interconnect lines. The low-dielectric-constant insulating layer generally has high hygroscopicity. This tendency increases with the lowering in the dielectric constant. An increase in the water content in the interlevel insulator lowers the insulation property, leading to the deterioration in the quality of the interconnect structure. Such a loss of reliability becomes more eminent in the case of a multilevel interconnect structure.

Such a loss of reliability of the interconnect structure, on the contrary, imposes a limitation on a tendency to reduce the dielectric constant of an interlevel insulator.

SUMMARY OF THE INVENTION

An object of the present invention is to provide an interconnect structure which brings about an improvement in the reliability of a miniaturized interconnect structure, facilitates the heightening of an interconnect performance and is capable of meeting the requirements of a multilevel miniaturized interconnect layer, fabrication process thereof.

In the present invention, there is thus provided a semiconductor device wherein a plurality of interconnect lines are disposed, through an insulating layer, on a same layer above a semiconductor substrate having a semiconductor element, a first interlevel insulator is formed selectively in a narrowly-spaced region between adjacent interconnect lines, a second interlevel insulator is formed in a widely-spaced region between adjacent interconnect lines, and said first interlevel insulator has a dielectric constant smaller than said second interlevel insulator.

Here, it is possible that said first interlevel insulator has been formed in a region of one section including said plurality of interconnect lines.

It is also possible that a portion of the insulating layer on said semiconductor substrate in a narrowly-spaced region between adjacent interconnect lines has been hold and said first interlevel insulator has been filled in a region between said interconnect lines and also in the holed region of said insulating layer.

It is also possible that third interlevel insulators having a dielectric constant greater than that of said first interlevel insulator have been formed on the upper surface of said interconnect lines and said first interlevel insulator has also been filled in a region between said third interlevel insulators on said interconnect lines.

It is also possible that a fourth interlevel insulator having a dielectric constant larger than that of said first interlevel insulator has been formed on a side wall of said interconnect lines.

It is also possible that in a multilevel interconnect structure formed on a semiconductor substrate, the lower and upper interconnect structures both have been formed to have the interconnect structure as described above.

In the present invention, there is also provided a process for the fabrication of a semiconductor device, which comprises a step of forming, on a semiconductor substrate, a base interlevel insulator and a first etching stopper layer by stacking them one after another; a step of forming an inorganic insulating layer having a predetermined thickness on said first etching stopper layer; a step of dry etching said inorganic insulating layer to form grooves for a plurality of interconnect patterns in said inorganic insulating layer while preventing the etching of said base interlevel insulator by using said first etching stopper layer as a stopper; a step of filling a metallic material in said grooves, thereby forming a plurality of interconnect lines; a step .of removing the inorganic insulating layer between predetermined ones of said interconnect lines while preventing the etching of the base interlevel insulator by using said first etching stopper layer as a stopper; and a step of embedding a low-dielectric-constant insulating layer in said inorganic-insulating-layer-removed region between adjacent interconnect lines.

In the present invention, there is also provided a process for the fabrication of a semiconductor device, which comprises a step of stacking and forming, on a semiconductor substrate, a base interlevel insulator, a first etching stopper layer, an intermediate interlevel insulator and a second etching stopper layer successively in the order of mention; a step of forming an inorganic insulating layer of a predetermined film thickness on said second etching stopper layer; a step of dry etching said inorganic insulating layer, thereby forming grooves for a plurality of interconnect patterns in said inorganic insulating layer while preventing the etching of said intermediate interlevel insulator by using said second etching stopper layer as a stopper; a step of filling a metallic material in said grooves, thereby forming a plurality of interconnect lines; a step of removing a predetermined region of the inorganic insulating layer between said interconnect lines, said second etching stopper layer and the intermediate interlevel insulator, by dry etching while preventing the etching of said base interlevel insulator by using said first etching stopper layer as a stopper; and a step of embedding a low-dielectric-constant insulating layer in the removed region between said interconnect lines.

In the present invention, there is also provided a process for the fabrication of a semiconductor device, which comprises a step of stacking and forming, on a semiconductor substrate, a base interlevel insulator, a first etching stopper layer, an intermediate interlevel insulator and a second etching stopper layer in the order of mention; a step of forming, on said second etching stopper layer, a first inorganic insulating layer having a predetermined thickness; a step of dry etching said first inorganic insulating layer to form grooves for a plurality of interconnect patterns in said first inorganic insulating layer, while preventing the etching of said intermediate interlevel insulator by using said second etching stopper layer as a stopper; a step of filling a metallic material in said grooves to form a plurality of interconnect lines and then adhering a second inorganic insulating layer on the upper surface of said first inorganic insulating layer and said interconnect lines; a step of removing a predetermined region of said second inorganic insulating layer, first inorganic insulating layer between said interconnect lines, said second etching stopper layer and said intermediate interlevel insulator by dry etching while preventing the etching of said base interlevel insulator by using said first etching stopper layer as a stopper; and a step of embedding a low-dielectric-constant insulating layer in the removed region between said interconnect lines.

In the present invention, there is also provided a process for the fabrication of a semiconductor device, which comprises a step of forming a base interlevel insulator on a semiconductor substrate; a step of forming, on said base interlevel insulator, an inorganic insulating layer having a predetermined film thickness; a step of dry etching said inorganic insulating layer to form therein grooves for a plurality of interconnect patterns; a step of filling a metallic material in said grooves, thereby forming a plurality of interconnect lines, a step of removing the inorganic insulating layer between predetermined ones of said interconnect lines by dry etching; and a step of embedding a low-dielectric-constant insulating layer in said inorganic-insulating-layer-removed region between said interconnect lines.

In the present invention, there is also provided a process for the fabrication of a semiconductor device, which comprises a step of forming a base interlevel insulator on a semiconductor substrate; a step of forming on said base interlevel insulator a first inorganic insulating layer having a predetermined film thickness; a step of dry etching said first inorganic insulating layer to form therein grooves for a plurality of interconnect patterns; a step of filling a metallic material in said grooves, thereby forming a plurality of interconnect lines, and adhering a second inorganic insulating layer onto the upper surface of said first inorganic insulating layer and said interconnect lines; a step of removing a predetermined region of said second inorganic insulating layer and the first inorganic insulating layer between said interconnect lines by dry etching; and a step of embedding a low-dielectric-constant insulating layer in said first- and second-inorganic-insulating-layers-removed region between said interconnect lines.

The above fabrication process may further comprises a step of forming a third inorganic insulating layer on side walls of said interconnect lines prior to the step of embedding said low-dielectric-constant insulating layer.

In the present invention, as described above, a low-dielectric-constant insulating layer is formed only in a predetermined region of a plurality of interconnect lines, and an insulating layer having low hygroscopicity, excellent in insulating property and dynamic strength is formed in the other region. The present invention therefore permits the easy fabrication of multilevel interconnection having a high propagation rate of signals and high reliability even in the case of a miniaturized structure.

BRIEF DESCRIPTION OF THE PREFERRED EMBODIMENTS

The embodiments of the present invention will next be described with reference to accompanying drawings.
[First Embodiment]

Figure 1:
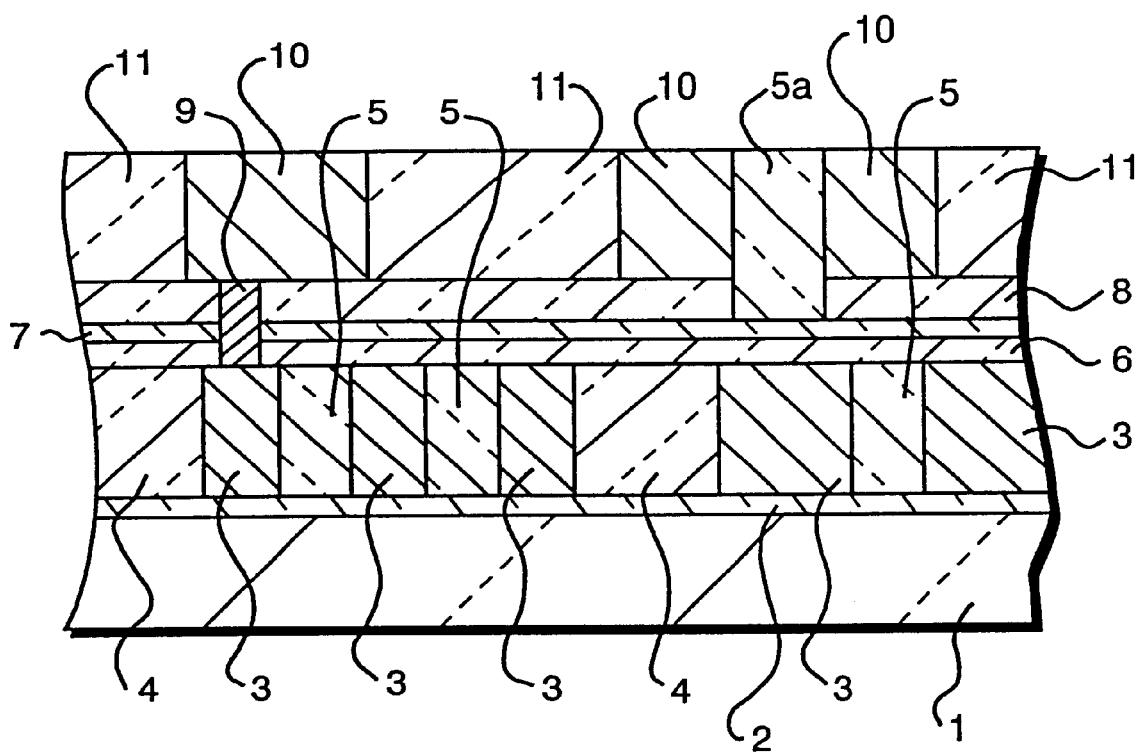
FIG. 1 is a cross-sectional view of an interconnect part for illustrating a first embodiment of the present invention.

FIG. 1 is a cross-sectional view of an interconnect part for illustrating the first embodiment and FIGS. 2 to 4 are cross-sectional views in the order of steps for the fabrication of such an interconnect part.

As illustrated in FIG. 1, a first stopper layer 2 having a thin film thickness is formed on a thick insulating layer 1 formed on the surface of a semiconductor substrate such as silicon substrate. Here, the thick insulating layer 1 is an element isolation insulating layer such as field oxide layer. On the first stopper layer 2, a plurality of lower interconnect lines 3 are formed.

In a widely-spaced region between adjacent interconnect lines in the lower interconnect lines, a first interlevel insulator 4 is formed, while in a narrowly-spaced region, a low-dielectric-constant insulating layer 5 is formed. Here, the first interlevel insulator 4 is composed of an ordinarily employed silicon dioxide layer and has a relative dielectric constant as high as about 4. On the other hand, the low-dielectric-constant insulating layer 5 is composed of an organic insulating layer or the like and is set to have a relative dielectric constant smaller than that of the first interlevel insulator 4.

A second interlevel insulator 6, a second stopper layer 7 and a third interlevel insulator 8 are formed by stacking them one after another so as to cover the lower interconnect layer therewith. In a predetermined region of the stacked insulating layers, a metal plug 9 is then filled to form an electrical connection with a lower interconnect line 3. On the third interlevel insulator 8, an upper interconnect line 10 is formed and is electrically connected with the metal plug 9. Here, the second interlevel insulator 6 and the third interlevel insulator 8 are each composed of an ordinarily employed silicon dioxide layer or the like having a low hygroscopicity.

Similar to the case of the lower interconnect layer described above, in a widely-spaced region between adjacent interconnect lines 10, a fourth interlevel insulator 11 is formed, while in a narrowly-spaced region between adjacent interconnect lines, a low-dielectric-constant insulating layer 5a is formed. Here, the fourth interlevel insulator 11 is composed of an ordinarily-employed silicon dioxide film and has a relative dielectric constant as high as about 4. On the other hand, the low-dielectric-constant insulating layer 5a is composed of an organic insulating film or the like and is set to have a relative dielectric constant smaller than that of the fourth interlevel insulator 11.

As described above, in the interconnect structure according to the present invention, an ordinarily employed insulating layer such as silicon dioxide film is formed in a widely-spaced region between adjacent interconnect lines. Here, the insulating layer is composed of an insulating material having low hygroscopicity and high strength. In a narrowly-spaced region between adjacent interconnect lines, a low-dielectric-constant insulating layer is formed selectively.

Figure 2A:
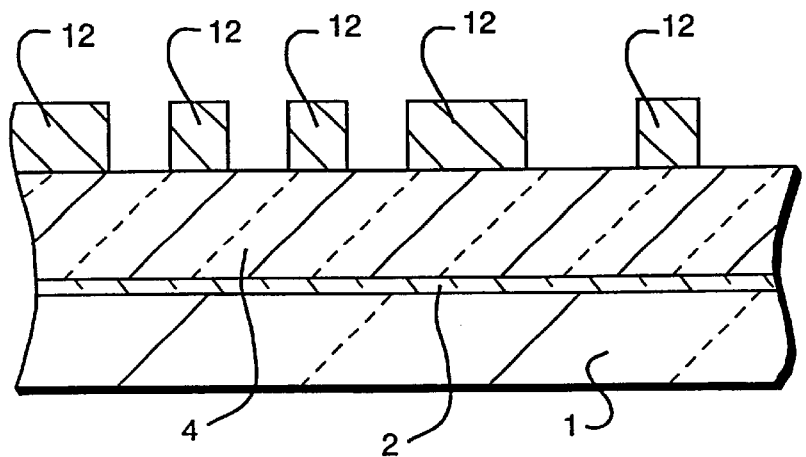
FIG. 2 is a cross-sectional view of the first embodiment of the present invention in the order of fabrication steps.

A description will next be made of a fabrication process of the interconnect structure as described above with reference to accompanying drawings 2 to 4. As illustrated in FIG. 2(a), a thick insulating layer 1 such as silicon dioxide layer is formed on a silicon substrate, followed by the formation of a first stopper layer 2 on the thick insulating layer 1. Here, the first stopper layer 2 is a silicon nitride film of about 50 nm thick which is deposited by the plasma CVD method which is a chemical vapor deposition (CVD) method.

On the first stopper layer 2, a first interlevel insulator 4 is then formed. The first interlevel insulator 4 is a silicon dioxide film of 500 nm thick which is deposited by the plasma CVD method. On the first interlevel insulator 4, resist masks 12 are formed by photolithography. The distance between the patterns of these resist masks 12 are set at 0.3 μm or so.

Figure 2B:
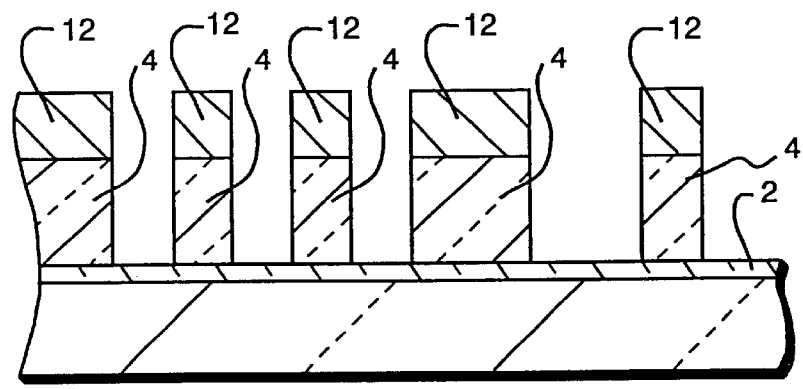

As illustrated in FIG. 2(b), the first interlevel insulator 4 is then processed by RIE with the resist masks 12 as etching masks. For RIE, a mixed gas of $C_4F_8$ and CO is used as a reaction gas. Such a gas hardly etches the first stopper layer 2 formed of a silicon nitride film, because a selection ratio, upon etching, of the first interlevel insulator 4 which is a silicon dioxide film becomes as high as about 30 compared with that of the first stopper layer 2.

Figure 2C:
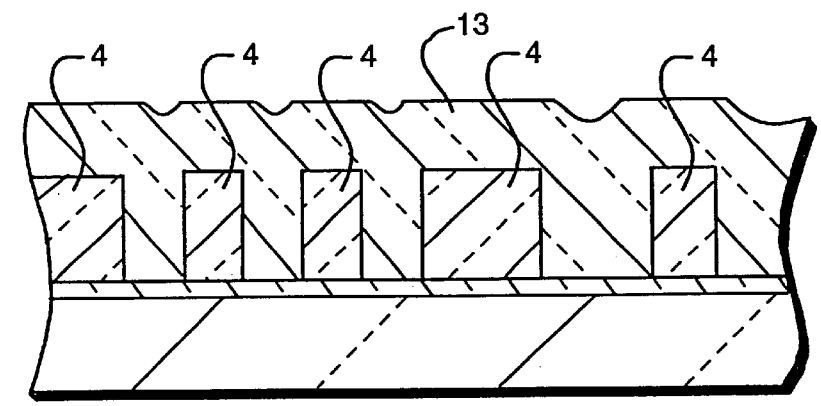

Resist masks 12 are then removed, followed by the deposition of a metal interconnect layer 13 by the CVD method so as to cover the first interlevel insulator 4 as illustrated in FIG. 2(c). Here, the metal interconnect layer 13 is Al or Cu, or alloy thereof, or a high-melting-point metal film such as tungsten.

Figure 2D:
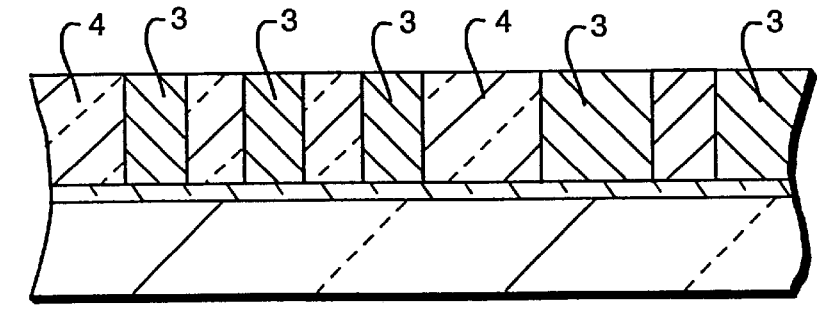

As illustrated in FIG. 2(d), the metal interconnect layer 13 is then polished by the CMP method to remove the unnecessary portions, whereby lower interconnect lines 3 embedded in the patterned first interlevel insulators 4 are formed. In other words, embedded interconnection (which will hereinafter be called "damascene interconnection") having an interconnect height of about 0.5 μm is formed.

Figure 3A:
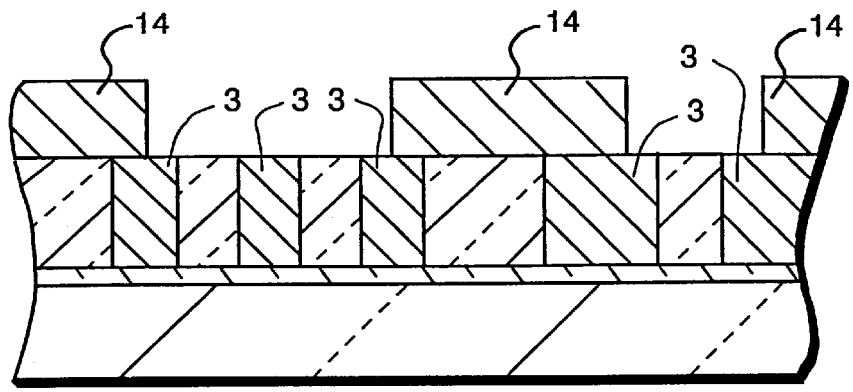
FIG. 3 is a cross-sectional view of the first embodiment of the present invention in the order of fabrication steps.

As illustrated in FIG. 3(a), resist masks are then formed so as to expose a portion of the first interlevel insulator 4 in a narrowly-spaced region between adjacent interconnect lines but to cover another portion of the first insulating layers 4 in a widely-spaced region between adjacent interconnect lines, in lower interconnect lines 3 of damascene interconnection.

Figure 3B:
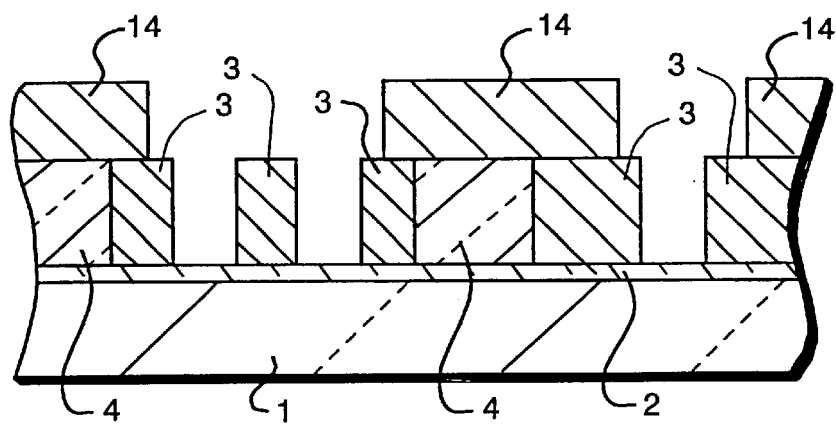

As illustrated in FIG. 3(b), only the above-described first interlevel insulator 4 in the narrowly-spaced region between adjacent interconnect lines is removed by RIE with resist masks 14 and a portion of the lower interconnect lines 3 as etching masks. Here, a mixed gas of $C_4F_8$ and CO is used as a reaction gas for RIE. When the above reaction gas is used, the lower interconnect lines 3 are not etched and also the thick insulating layer 1 is not etched, protected by the first stopper layer 2.

Figure 3C:
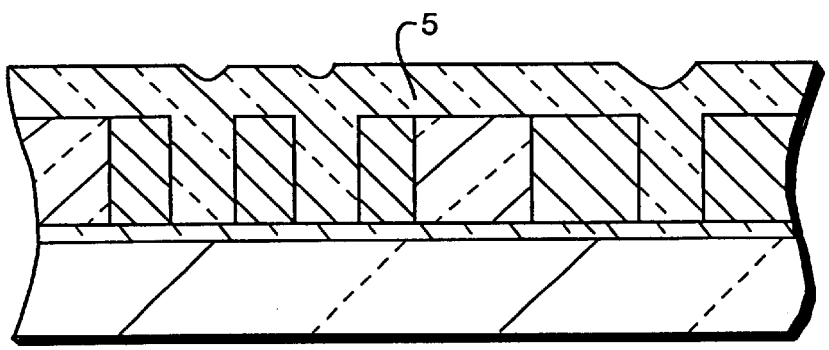

As illustrated in FIG. 3(c), a low-dielectric-constant insulating layer 5 is formed all over the surface. For example, a coating solution to form an organic SOG film is applied all over the surface by roll coating. Here the coating solution is filled in a space between the lower interconnect lines 3 from which the first interlevel insulator 4 has been removed. The coating solution is then thermoset by heat treatment, whereby the above-described organic SOG film is formed. The organic SOG film so formed has a relative dielectric constant of 3 or smaller.

Figure 3D:
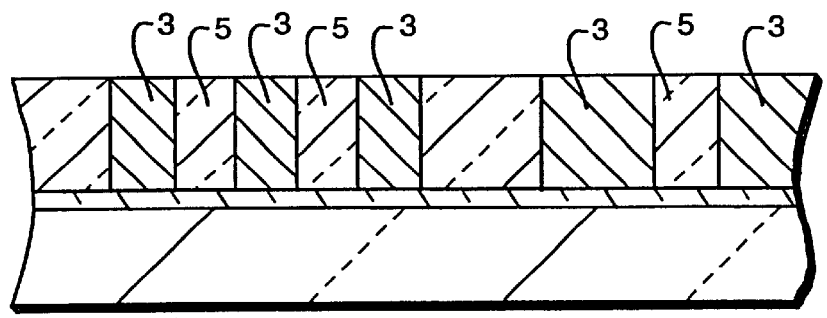

The organic SOG film which is a low-dielectric-constant insulating layer 5 is then polished by the CMP method to remove unnecessary portions from the layer and planarized. As illustrated in FIG. 3(d), a low-dielectric-constant insulating layer 5 is formed selectively in a narrowly-spaced region between adjacent lower interconnect lines 3.

Figure 4A:
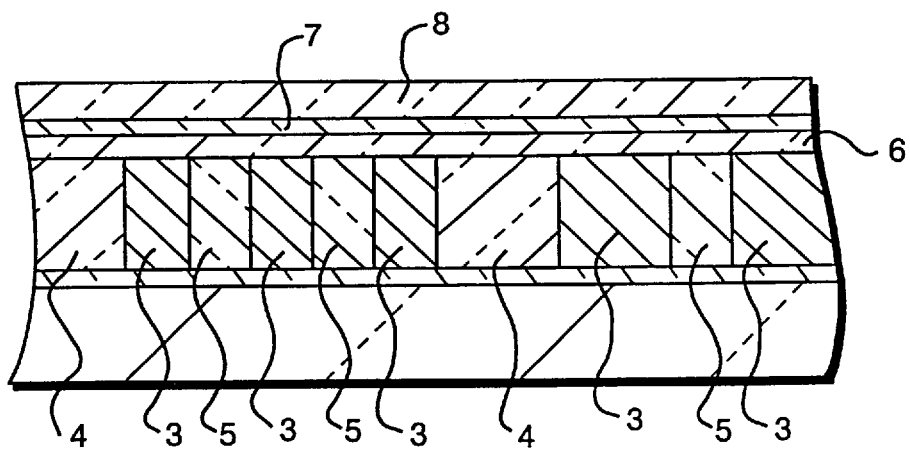
FIG. 4 is a cross-sectional view of the first embodiment of the present invention in the order of fabrication steps.

As illustrated in FIG. 4(a), a second interlevel insulator 6, a second stopper layer 7 and a third interlevel insulator 8 are formed by stacking them one after another so as to cover the lower interconnect lines 3, first interlevel insulator 4 and low-dielectric-constant insulating layer 5. Here, the second interlevel insulator 6 and third interlevel insulator 8 are silicon dioxide films of 200 nm and 300 nm thick, respectively, deposited by the plasma CVD method. The second stopper layer 7 is, on the other hand, a silicon nitride film of about 50 nm thick deposited by the plasma CVD method.

Figure 4B:
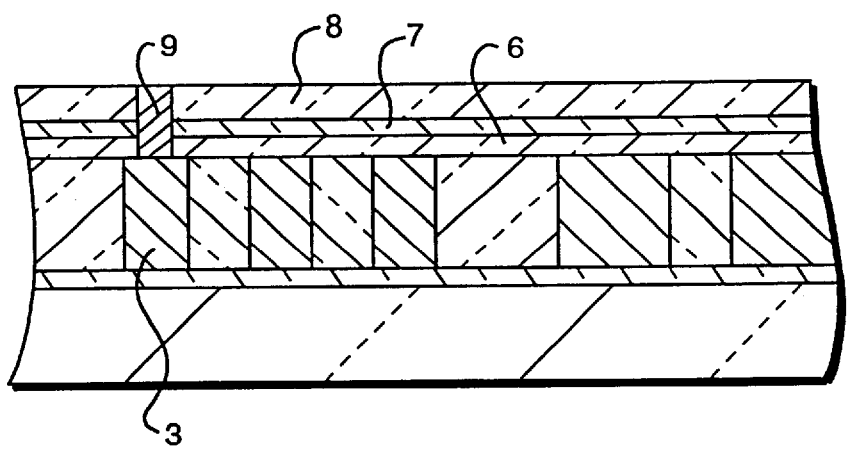

As illustrated in FIG. 4(b), in a predetermined region of the second interlevel insulator 6, second stopper layer 7 and third interlevel insulator 8 is then formed a through-hole, in which a metal plug 9 is filled to form an electrical connection with one of the lower interconnect lines 3. Here, the metal plug 9 is formed, for example, by polishing unnecessary portions of a tungsten film, which has been deposited by the CVD method, by the CMP method.

The third interlevel insulator 8 is then overlaid with upper interconnect lines 10 and a fourth interlevel insulator 11. The upper interconnect layer is formed in a similar manner to the above-described lower interconnect layer.

Figure 4C:
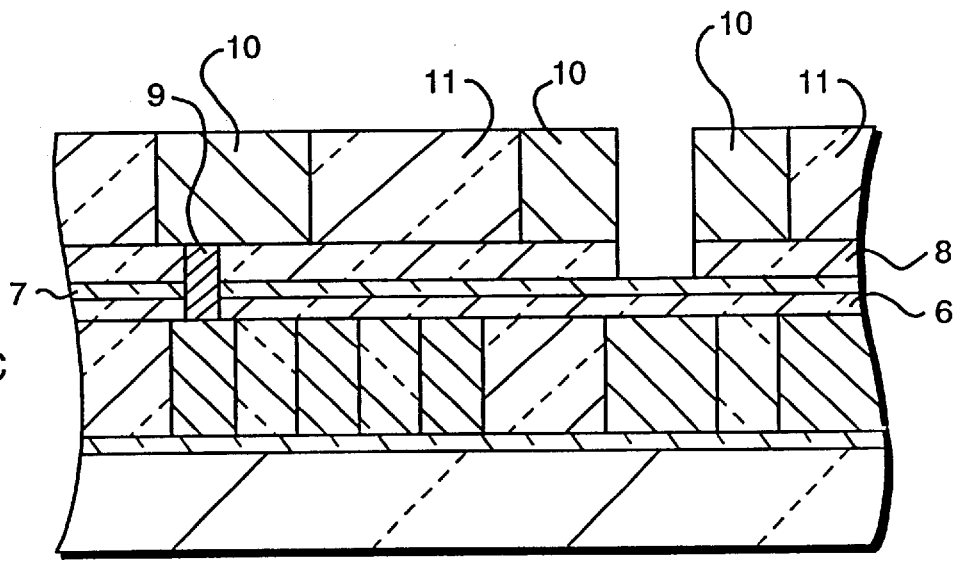

As illustrated in FIG. 4(c), the fourth interlevel insulator 11 and the third interlevel insulator 8 in a narrowly-spaced region between adjacent upper interconnect lines 10 are etched successively by RIE as described with reference to FIGS. 3(a) and (b). Here, a mixed gas of $C_4F_8$ and CO is used as a reaction gas for RIE. When dry etching is effected using such a reaction gas, the second stopper layer 7 is hardly etched so that the second interlevel insulator 6 is protected from etching.

A low-dielectric-constant insulating layer 5a is embedded in the etched portion between the upper interconnect lines 10 as described in FIG. 1. Here, the low-dielectric-constant insulating layer 5a is formed in a similar manner to the low-dielectric-constant insulating layer 5 between the lower interconnect lines 3.

As described above, a low-dielectric-constant insulating layer is selectively formed in a predetermined region so that even in the case of a miniaturized interconnect structure, both of lowering in the propagation rate of signals due to a marked increase in a parasitic capacitance between interconnect layers and frequent occurrence of crosstalk between interconnect layers can be prevented.

In addition, an interlevel insulator having a small coefficient of thermal expansion and high strength is used in a widely-spaced region between interconnect lines, which makes it possible to overcome the problem of crack generation in an interlevel insulator which would take place when a low-dielectric-constant insulating layer is used in all the regions as an interlevel insulator.

Furthermore, in the present invention, an interlevel insulator is formed so as to be embedded between the interconnect lines in the lower interconnect layer, which prevents the formation of a large stepped portion on the surface of the interlevel insulator, thereby making it much easier to form the upper interconnect layer of multilevel interconnection.

[Second Embodiment]

Figure 5:
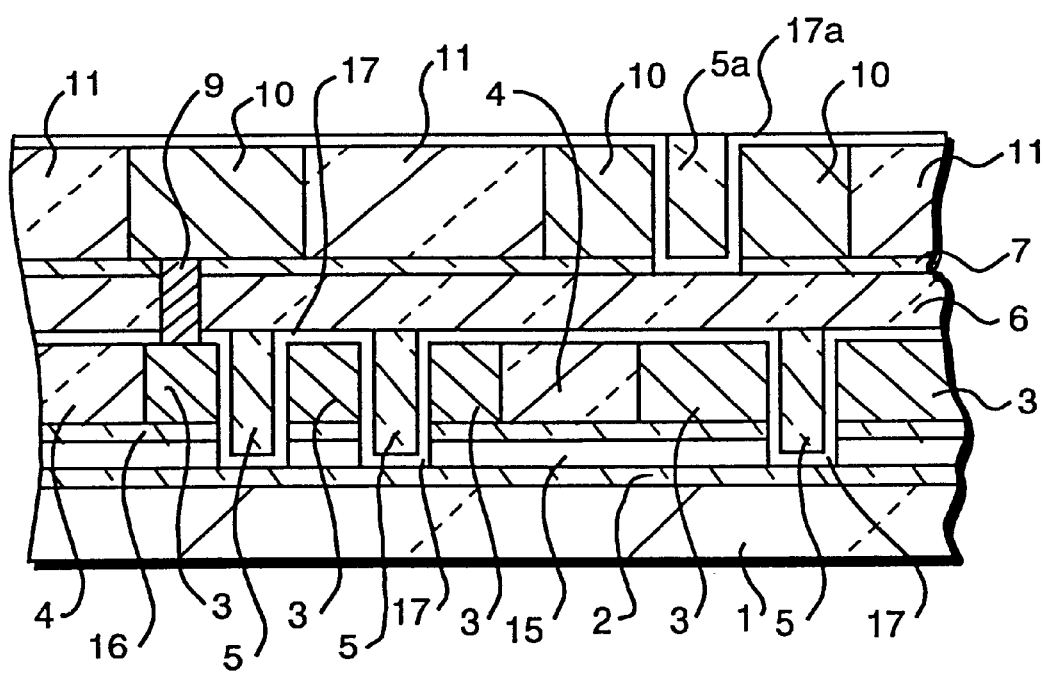
FIG. 5 is a cross-sectional view of an interconnect part for illustrating a second embodiment of the present invention.

A description will next be made of the second embodiment of the present invention with reference to FIGS. 5 and 6. FIG. 5 is a cross-sectional view of an interconnect part for illustrating the second embodiment of the present invention; and FIG. 6 is a cross-sectional view of such an interconnect structure in the order of fabrication steps. The members similar to those in the first embodiment are indicated by the like reference numerals.

As illustrated in FIG. 5, a first stopper layer 2 having a small film thickness is formed on a thick insulating layer 1 formed on the surface of a semiconductor substrate. Here, the thick insulating layer 1 is an element isolation insulating layer such as field oxide layer. On the first stopper layer 2, an intermediate insulating layer 15 is formed. The intermediate insulating layer 15 is overlaid with a third stopper layer 16, followed by the formation of a plurality of lower interconnect lines 3 on the third stopper layer 3.

Similar to the first embodiment, a first interlevel insulator 4 is formed in a widely-spaced region between adjacent lower interconnect lines 3, while a low-dielectric-constant insulating layer 5 is formed in a narrowly-spaced region between adjacent interconnect lines. In this case, as illustrated in FIG. 5, a protective insulating layer 17 is formed between lower interconnect lines and low-dielectric-constant insulating layers 5.

A second interlevel insulator 6 and a second stopper layer 7 are formed by stacking them one after another so as to cover the lower interconnect layers so formed. A metal plug 9 is filled in a predetermined region of the stacked insulating layers to form an electric connection with one of the lower interconnect lines 3. Upper interconnect lines 10 are formed on the second stopper layer 7 and one of them is electrically connected with the metal plug 9.

In a similar to the above-described lower interconnect layer, a fourth interlevel insulator 11 is formed in a widely-spaced region between upper interconnect lines 10, while a low-dielectric-constant insulating layer 5a is formed in a narrowly-spaced region between adjacent interconnect lines. Here, a protective insulating layer 17a is formed between the upper interconnect lines 10 and a low-dielectric-constant insulating layer 5a.

As described above, an insulating layer having low hygroscopicity and high strength is formed in a widely-spaced region between adjacent interconnect lines, while a low-dielectric-constant insulating layer is selectively formed in a narrowly-spaced region between adjacent interconnect lines. In this case, a protective insulating film is formed between the interconnect layers and low-dielectric-constant insulating layer.

A description will next be made of a fabrication process of the interconnect structure as described above with reference to FIG. 6. Fabrication steps up to that illustrated in FIG. 3(b) are effected as in the first embodiment.

Figure 6A:
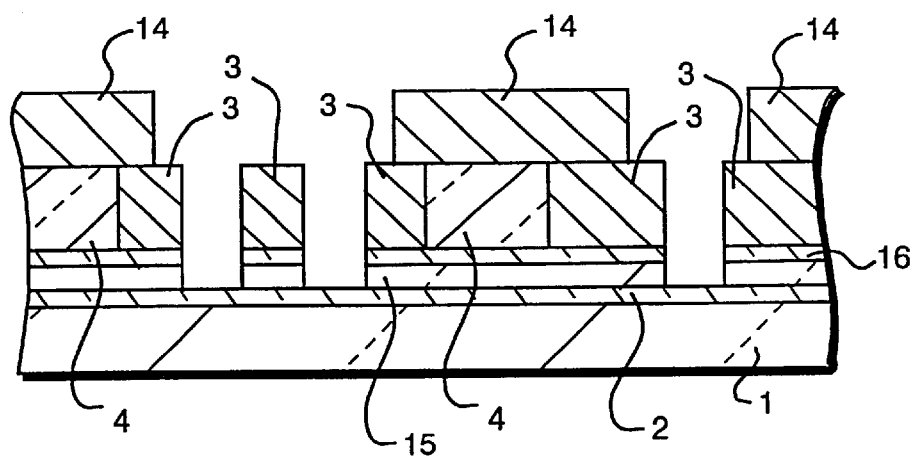
FIG. 6 is a cross-sectional view of the second embodiment of the present invention in the order of fabrication steps.

Described specifically, as illustrated in FIG. 6(a), a thick insulating layer 1 is overlaid with a first stopper layer 2, followed by the formation of an intermediate insulating layer 15 on the first stopper layer 2 by the CVD method. Here, the intermediate layer 15 is a silicon dioxide film of about 300 nm thick. A third stopper layer 16 is deposited by the plasma CVD method. The third stopper layer 16 is a silicon nitride film of about 50 nm thick.

Lower interconnect lines 3 and a first interlevel insulator 4 are formed by the formation method of damascene interconnection. Resist masks 14 are then formed, and with these resist masks 14 and a portion of the lower interconnect lines 3 as etching masks, the first interlevel insulator 4, third stopper layer 16 and intermediate insulating layer 15 are removed by RIE from a narrowly-spaced region between adjacent interconnect lines. Here the distance between the lower interconnect lines are set at about 3.5 μm. As illustrated in FIG. 6(a), the interlevel insulator between the lower interconnect lines 3 are removed by etching even to a region deeper than the position of the bottom surface of the interconnect lines.

Figure 6B:
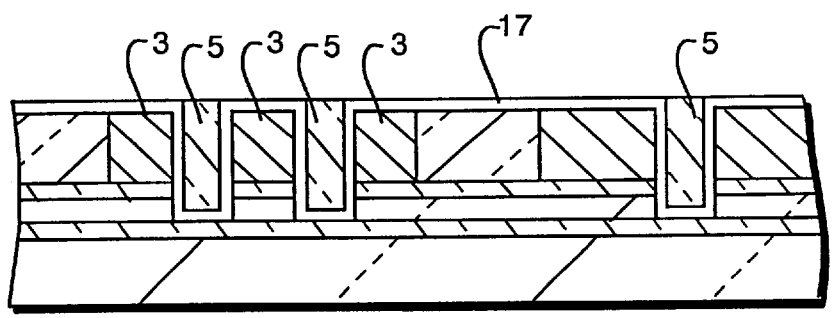

As illustrated in FIG. 6(b), a protective insulating layer 17 having a small film thickness is formed to cover all over the surface. The protective insulating layer 17 is a silicon oxide film of about 50 nm thick deposited by the plasma CVD method. Then, a low-dielectric-constant insulating layer 5 is formed by filling the same. As the low-dielectric-constant insulating layer 5, an organic insulating film having hygroscopicity, for example, a polyimide film is used. Alternatively, an inorganic insulating layer such as SiOF or SiBN film is used. In the above manner, the low-dielectric-constant insulating layer 5 to be formed between the lower interconnect lines 3 is filled into a region deeper than the position of the bottom surface of the interconnect lines.

Figure 6C:
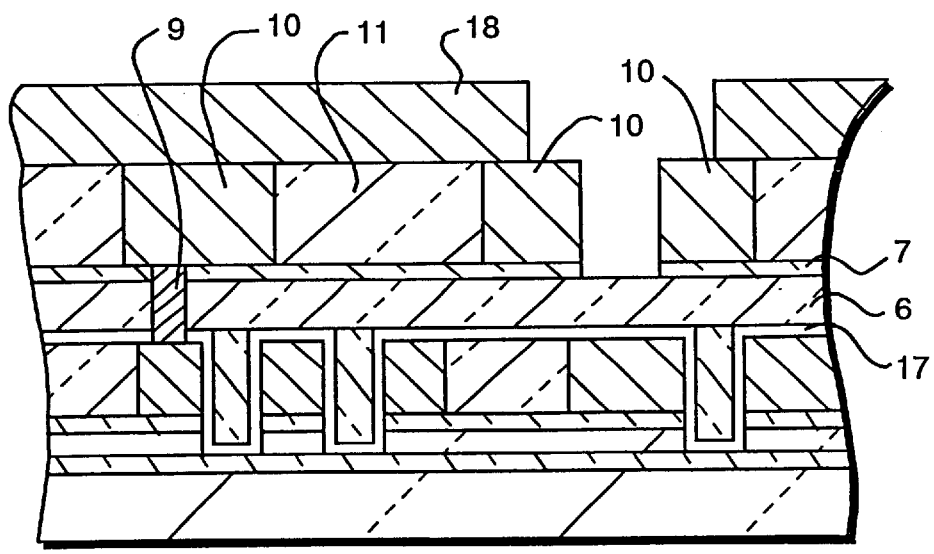

As illustrated in FIG. 6(c), a second interlevel insulator 6 and a second stopper layer 7 are formed on the protective insulating layer 17 and low-dielectric-constant insulating layer 5 by stacking them one after another. Here, the second interlevel insulator 6 is a silicon dioxide film of about 500 nm thick deposited by the plasma CVD method. The second stopper layer 7 is, on the other hand, a silicon nitride film of about 50 nm thick deposited by the plasma CVD method.

In a predetermined region of the second interlevel insulator 6, second stopper layer 7 and protective insulating layer 7, formed is a through-hole, in which a metal plug 9 is filled to form an electric connection with the lower interconnect lines 3. Here, the metal plug 9 is formed, for example, by polishing an unnecessary portion of a tungsten film, which has been deposited by the CVD method, by the CMP method.

The second stopper layer 7 is then overlaid with upper interconnect lines 10 and a fourth interlevel insulator 11. The formation method of such an upper interconnect layer is similar to that of the interconnect layer in the first embodiment. As illustrated in FIG. 6(c), a resist mask 18 is formed and the fourth interlevel insulator 11 and second stopper layer 7 between the upper interconnect lines 10 are etched successively by RIE.

Then, a protective insulating layer 17a is formed all over the surface after resist masks 18 are remved, as illustrated in FIG. 5. The protective insulating layer 17a is formed in a similar manner to the above-described protective insulating layer 17. A low-dielectric-constant insulating layer 5a is filled between the upper interconnect lines 10. The low-dielectric-constant insulating layer 5a is formed in a similar manner to the low-dielectric-constant insulating layer 5 between the lower interconnect lines 3.

According to the second embodiment, a low-dielectric-constant insulating layer is filled between adjacent interconnect lines having a surface covered with a protective insulating layer. It is therefore possible to employ as the low-dielectric-constant insulating layer that having high hygroscopicity or low insulating property.

A low-dielectric-constant insulating layer formed between lower interconnect lines has been filled into a region deeper than the position of the bottom surface of the interconnect lines so that a parasitic capacitance formed between the bottom portions of adjacent interconnect lines, that is, between the end portions of adjacent interconnect lines can be reduced.

[Third Embodiment]

Figure 7:
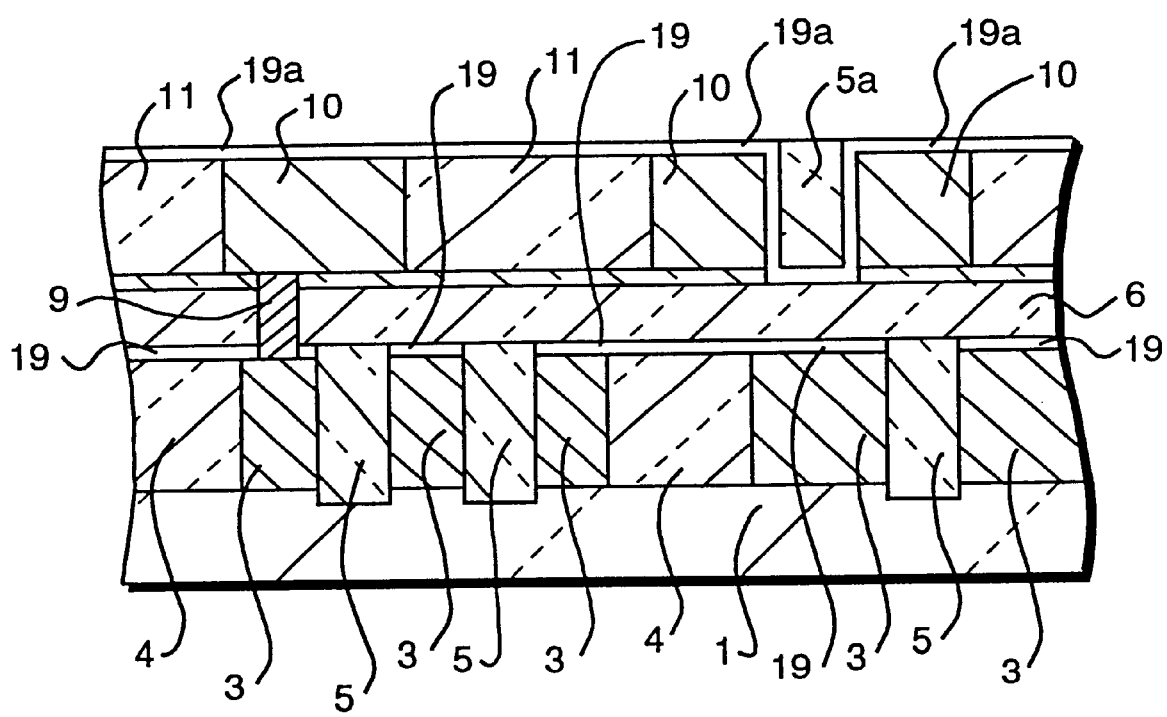
FIG. 7 is a cross-sectional view of an interconnect part for illustrating a third embodiment of the present invention.
Figure 8A:
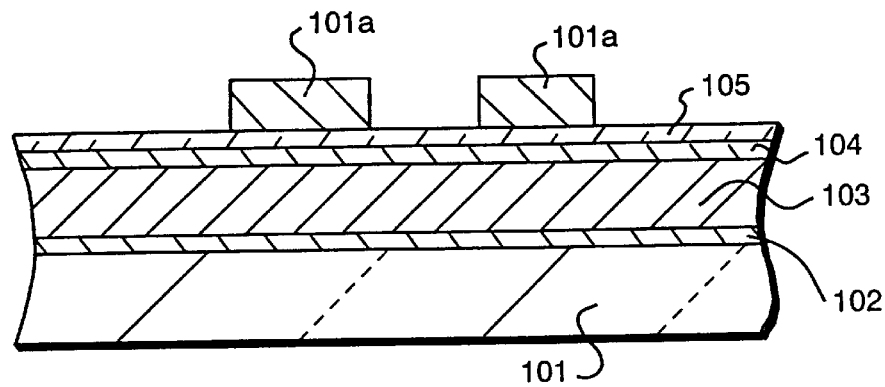
FIG. 8 is a cross-sectional view illustrating the conventional art in the order of fabrication steps.
Figure 8B:
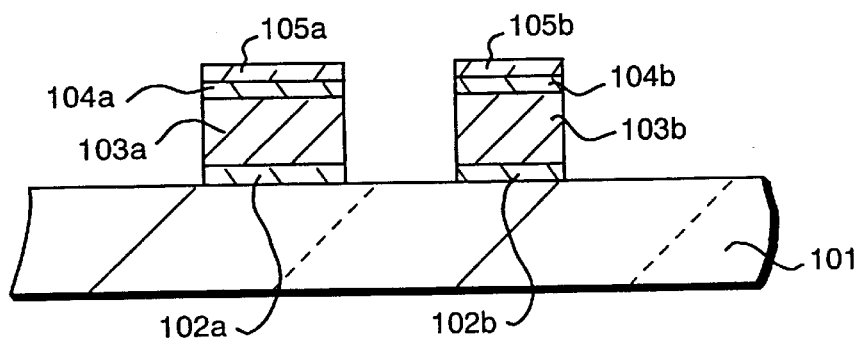
Figure 8C:
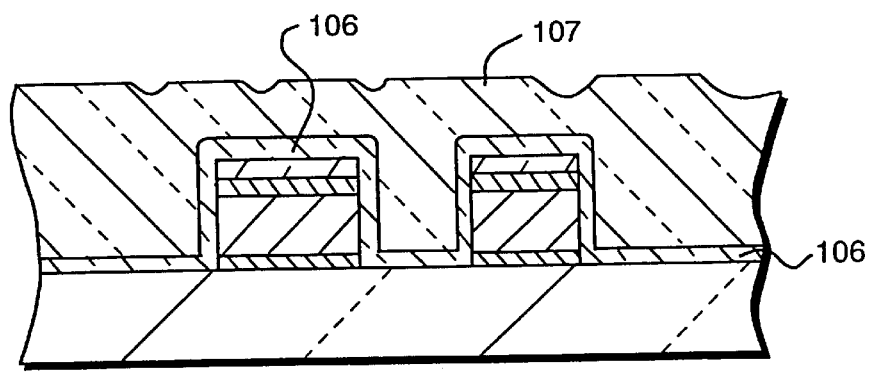
Figure 8D:
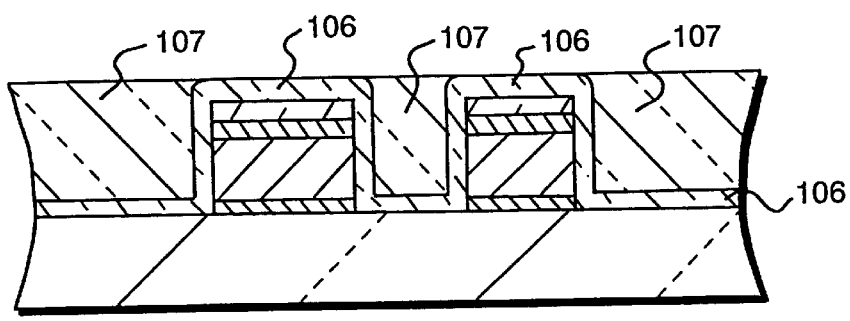
Figure 9A:
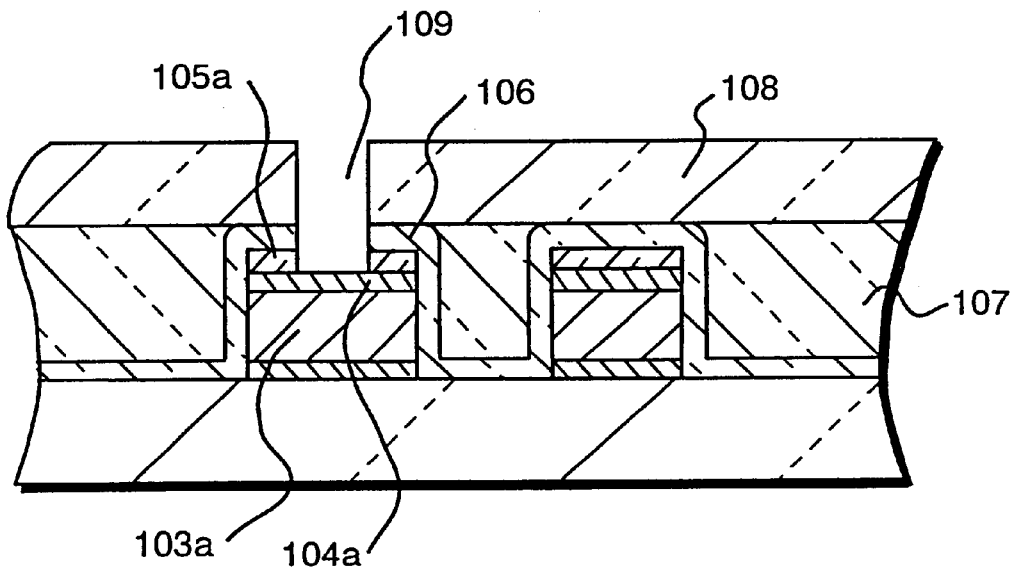
FIG. 9 is another cross-sectional view illustrating the conventional art in the order of fabrication steps.
Figure 9B:
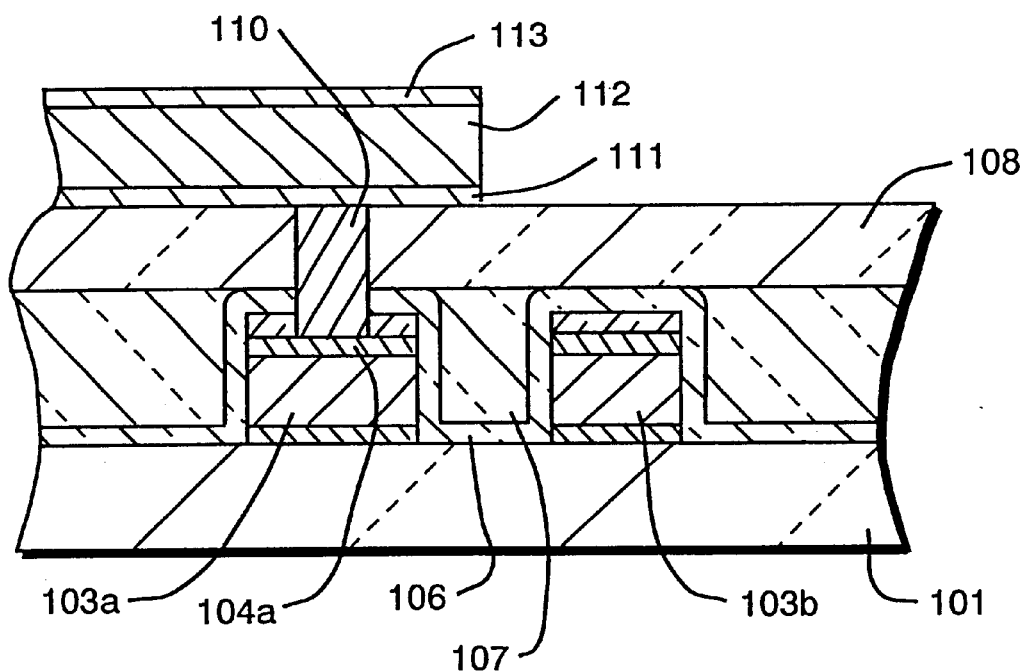

A description will next be made of the third embodiment of the present invention with reference to FIG. 7. FIG. 7 is a cross-sectional view of an interconnect portion for illustrating the third embodiment.

As illustrated in FIG. 7, a plurality of lower interconnect lines 3 and a first interlevel insulator 4 are formed on a thick insulating layer 1 by the damascene method. On the lower interconnect lines 3, a hard mask layer 19 is formed. This hard mask layer 19 is a silicon dioxide film of about 300 nm thick. In a narrowly-spaced region between interconnect lines, a low-dielectric-constant insulating layer 5 is formed. Here, the surface of the thick insulating layer 1 is etched. The low-dielectric-constant insulating layer 5 is filled in a region ranging from a position deeper than the bottom surface of the lower interconnect lines 3 even to a position higher than the upper surface of the lower interconnect lines 3. The first interlevel insulator 4 is composed of an ordinarily employed silicon dioxide film, while the low-dielectric-constant insulating layer 5 is composed of an organic insulating layer or the like. A relative dielectric constant of the low-dielectric-constant insulating layer 5 is set to become smaller than that of the first interlevel insulator 4. Incidentally, an etching stopper layer is not formed in this embodiment so that etching is controlled by time.

A second interlevel insulator 6 is formed so as to cover the lower interconnect layer thus formed and it is planarized by the CMP method. In a predetermined region of the second interlevel insulator 6, a metal plug 9 is formed to provide an electrical connection with the lower interconnect lines 3. On the second interlevel insulator 6, upper interconnect lines 10 and a hard mask layer 19a are formed and connected electrically with the metal plug 9. Here, the second interlevel insulator 6 is formed of a conventionally-employed silicon dioxide film or the like having low hygroscopicity.

In a similar manner to the lower interconnect lines as described above, a fourth interlevel insulator 11 is formed in a widely-spaced region between the upper interconnect lines 10, while a low-dielectric-constant insulating layer 5a is formed in a narrowly-spaced region between interconnect lines. The surface of the second interlevel insulator 6 is etched so that the low-dielectric-constant insulating layer 5a is filled into a position deeper than the bottom surface of the upper interconnect lines 10. The low-dielectric-constant insulating layer 5a is filled into a position higher than the upper surface of the upper interconnect lines 10.

The fabrication process of the above interconnect structure is similar to that described in the first embodiment but differs mainly in that an etching stopper layer is not formed and a hard mask layer is formed. In the interconnect structure according to the third embodiment, a predetermined region of a thick insulating layer 1 corresponding to a region between interconnect layers is holed and a hard mask layer is formed on the upper surface of the interconnect lines. The hard mask layer is formed as follows. In a similar manner to the first embodiment, grooves are formed in the first interlevel insulator 4 and a metallic material is filled in the grooves to form lower interconnect lines 3. Then, the upper surface of the lower interconnect lines are overlaid with an inorganic insulating layer, for example, to a thickness of 200 nm as the hard mask layer. A resist is formed on the upper surface of the hard mask layer. A portion of the resist on a region to form a low-dielectric-constant insulating layer therein is removed and with the remaining portion of the resist as a mask, the inorganic insulating layer and the interlevel insulator thereunder are etched. In the etched portion, a low-dielectric-constant insulating layer is formed.

The third embodiment makes it possible to reduce a parasitic capacitance formed between the bottom portions and top portions of the adjacent interconnect lines, that is, end portions of the adjacent interconnect lines.

Incidentally, examples of the low-dielectric-constant insulating film usable in the present invention include, in addition to those described in the above embodiments, HSQ (hydrogen silsesquioxane), polyaryl ether, fluorinated polyaryl ether, inorganic polysilazane, organic polysilazane, BCB (benzocyclobutene), MSQ (methyl silsesquioxane), fluorinated polyimide, plasma CF polymer, plasma CH polymer, teflon AF(trade mark), parylene N(trade mark; polyparaxylylene N), parylene AF-4(trade mark; polyparaxylylene F) and polynaphthalene N.

As described above, in the interconnect structure of the semiconductor device according to the present invention, an insulating layer, such as silicon dioxide film, having high strength and low hygroscopicity is formed in a widely-spaced region between interconnect lines, while a low-dielectric-constant insulating layer is formed selectively in a narrowly-spaced region between interconnect lines.

Even if the interconnect structure becomes miniaturized and a distance between interconnect lines becomes narrow, a reduction in a propagation rate of signals due to a marked increase in the parasitic capacitance between interconnect layers and frequent occurrence of crosstalk between interconnect layers can therefore be prevented.

In addition, it becomes possible, as described above, to select an interlevel insulator having a small coefficient of thermal expansion and a high strength in a widely-spaced region between interconnect lines, which completely prevents cracks in the interlevel insulator which tend to occur in the case where a low-dielectric-constant insulating layer is used for the whole region as an interlevel insulator.

Furthermore, in the present invention, an interlevel insulator is formed so as to fill it between interconnect lines in a low interconnect layer, which prevents the formation of a large stepped portion on the surface of the interlevel insulator, thereby making it easier to form the upper interconnect layer of a multilevel interconnection.

In the above-described manners, the present invention facilitates the heightening of performance and improvement of reliability of miniaturized multilevel interconnection associated with miniaturization or function increase of the semiconductor device.

What is claimed is:

1. A semiconductor device, comprising:

a plurality of interconnect lines;

a first insulating material disposed in regions in which said interconnect lines are relatively widely spaced; and a second insulating material disposed in regions in which said interconnect lines are relatively narrowly-spaced, said second insulating material having a dielectric constant lower than a dielectric constant of said first insulating material and substantially filling the space between said narrowly spaced interconnect lines.

2. A semiconductor device, according to claim 1, wherein said first insulating material disposed in said relatively widely spaced regions has lower hygroscopicity and higher strength than said second insulating material.

3. A semiconductor device, comprising:

a plurality of interconnect lines;

a first insulating material disposed in regions in which said interconnect lines are relatively widely spaced; and a second insulating material disposed in regions in which said interconnect lines are relatively narrowly-spaced, said second insulating material having a dielectric constant lower than a dielectric constant of said first insulating material, wherein said first insulating material has lower hygroscopicity and higher strength than said second insulating material, wherein said first insulating material is silicon dioxide and said second insulating material is an organic insulating material.

4. A semiconductor device, comprising:

a plurality of interconnect lines;

a first insulating material disposed in regions in which said interconnect lines are relatively widely spaced; and a second insulating material disposed in regions in which said interconnect lines are relatively narrowly-spaced, said second insulating material having a dielectric constant lower than a dielectric constant of said first insulating material, further comprising:

a third insulating material having a dielectric constant greater than the dielectric constant of said first insulating material, said third insulating material being formed on upper surfaces of said interconnect lines.

* * * * *